(12) United States Patent
Lien et al.

(10) Patent No.: US 7,644,311 B2
(45) Date of Patent: Jan. 5, 2010

(54) LOGIC SOFT ERROR RATE PREDICTION AND IMPROVEMENT

(75) Inventors: Chuen-Der Lien, Los Altos Hills, CA (US); Pao-Lu Louis Huang, San Jose, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 392 days.

(21) Appl. No.: 11/395,119

(22) Filed: Mar. 31, 2006

(65) Prior Publication Data
US 2007/0234125 A1 Oct. 4, 2007

(51) Int. Cl.
*G06F 11/00* (2006.01)
(52) U.S. Cl. .............................. 714/37; 714/25; 703/13; 703/16; 716/4
(58) Field of Classification Search .................. 714/25, 714/37; 703/13, 16
See application file for complete search history.

(56) References Cited

U.S. PATENT DOCUMENTS

| 6,986,078 | B2 * | 1/2006 | Rodbell et al. | 714/10 |
| 7,236,919 | B2 * | 6/2007 | Fulkerson | 703/16 |
| 2004/0212388 | A1 * | 10/2004 | Baumann | 324/765 |
| 2007/0166847 | A1 * | 7/2007 | Fulkerson | 438/17 |
| 2007/0226572 | A1 * | 9/2007 | Zhang et al. | 714/742 |
| 2007/0234125 | A1 * | 10/2007 | Lien et al. | 714/37 |
| 2008/0077376 | A1 * | 3/2008 | Belhaddad et al. | 703/13 |
| 2008/0281572 | A1 * | 11/2008 | Puri et al. | 703/16 |

* cited by examiner

*Primary Examiner*—Emerson C Puente
(74) *Attorney, Agent, or Firm*—Finnegan, et al.

(57) ABSTRACT

A process and system for estimating the soft error rate of an integrated circuit. The process involves determining the surface area of and charge stored on each logic node on the integrated circuit. Then a response curve is used to estimate the soft error rate for a logic node using the charge stored on the logic node. Different response curves exist for integrated circuits of different technologies and products. Finally, the soft error rate of the integrated circuit can be estimated using the soft error rates for each logic node.

20 Claims, 8 Drawing Sheets

LOGIC SOFT ERROR RATE PREDICTION AND IMPROVEMENT

BACKGROUND

1. Field of the Invention

The present invention relates to integrated circuits, and in particular, to predicting the soft error rate at logic nodes in integrated circuits.

2. Discussion of Related Art

Logic nodes in integrated circuits ("ICs") have become increasingly susceptible to errors caused by radiation. Part of the reason for this increase lies with the efforts by IC manufacturers to reduce device sizes and decrease power usage. For example, to increase processing speeds, manufacturers have lowered both the capacitance of and the voltage across the logic nodes in the IC. At the same time, IC manufacturers have decreased the size of the logic nodes to decrease the overall size of the IC. By taking these actions, however, IC manufacturers have also decreased the charge used by the logic node, making them more vulnerable to interference by outside radiation. As a result, IC manufacturers have seen an increasing soft error rate, presumably caused by radiation incident at the logic nodes. A soft error occurs when only the data on a system is corrupted. The system components usually sustain no damage during the event. Because logic nodes manipulate, but do not store, data, the error rate at logic nodes is measured in terms of the soft error rate ("SER"), which is the number of failures per logic node over a period of time.

Figure 1:
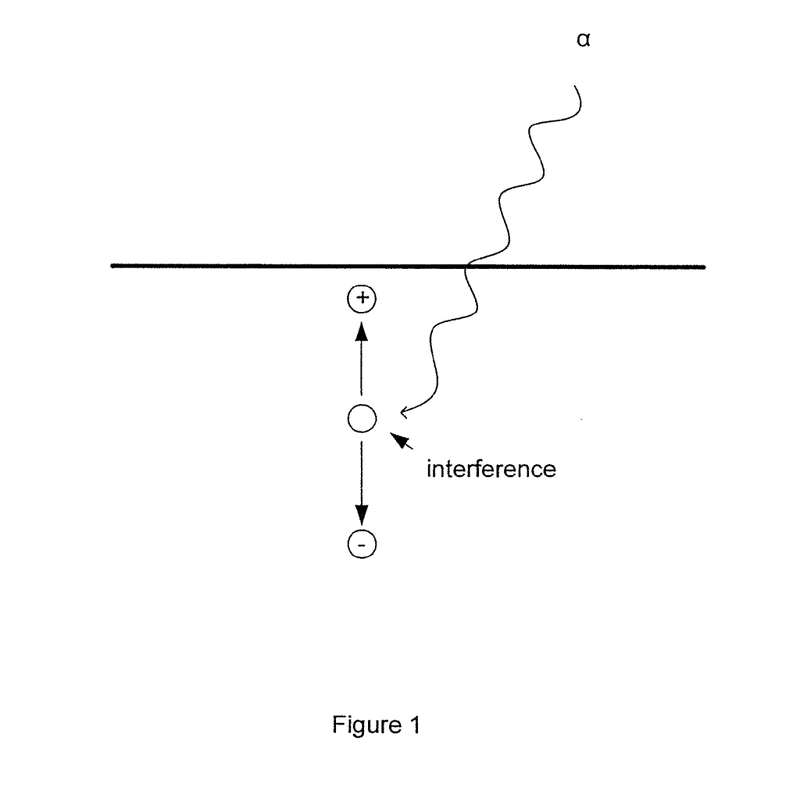
FIG. 1 illustrates the results of an alpha particle incident on an integrated circuit.
Figure 2:
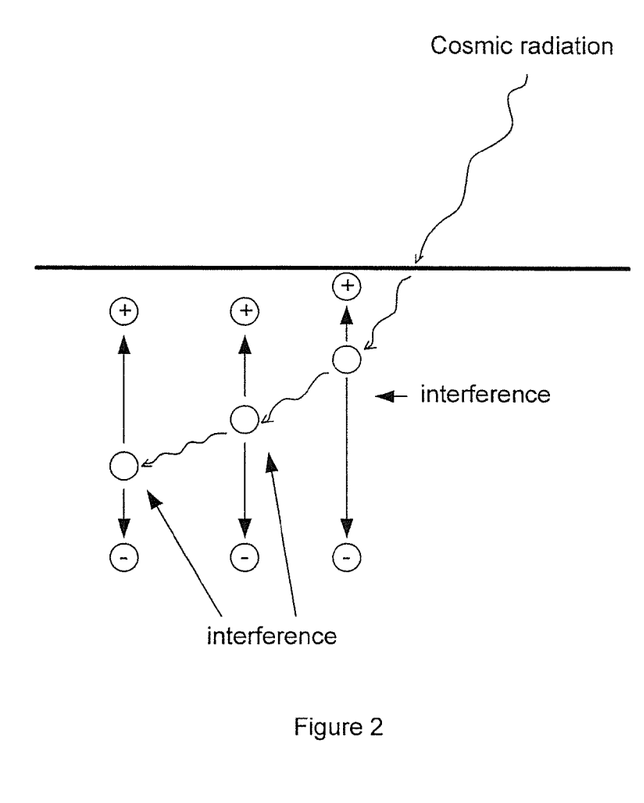
FIG. 2 illustrates the results of a neutron incident on an integrated circuit.

A soft error is typically the result of a sequence of events. A soft error begins with a single event upset ("SEU") in which external radiation strikes an IC creating a pulse on a logic line. This radiation can come from a variety of sources. For example, as shown in FIG. 1, alpha particles can be emitted radioactivity from a variety of sources, such as from the contact material, the surrounding packaging, or even the semiconductor material itself. When these alpha particles strike the IC, they may create electron-hole pairs in the logic node, causing a pulse to form. In another example, the radiation may come from high energy neutrons coming from space, as shown in FIG. 2. The largest source of neutrons is extra-terrestrial. Therefore, until now, high energy neutrons have only created problems for ICs in space or at high altitude. With the decreasing amount of charge used by the logic node, however, these high energy neutrons are beginning to cause problems at sea-level as well. Furthermore, a single high energy neutron can cause a small reaction in which more than just one electron-hole pair is created. Accordingly, a high energy neutron does not need to directly impact a logic node to cause an SEU, and a single neutron can cause SEUs to occur in more than one logic node.

If a pulse caused by outside radiation is strong enough and of sufficient duration, the pulse may propagate through the IC as an erroneous signal. For today's technology, the pulse need only last less than about one pico-second for it to propagate through the IC. In addition, the charge needed to cause an SEU in present day devices is less than about 10 femtocoulombs. Further, the level of charge needed to cause an SEU will decrease as new technologies require less charge to operate. Moreover, the pulse duration needed to cause an SEU will continue to decrease as processor speeds increase. Accordingly, SER also promises to increase as processing speed increases and IC size decreases.

The pulse that results from an SEU propagates through the IC if it is produced at a time that matches the timing of the IC. Additionally, before the pulse can propagate, the logic path that it impacts must be enabled. For example, if the pulse goes through one input of an XOR gate, then the other input must be at a low state. Also, the pulse should be latched if it is to contribute to an SER. For example, a pulse that overlaps with a rising clock edge at the input to a latch will be latched, provided that the pulse is of sufficient duration to satisfy the set-up and hold times of the latch. If the pulse is latched, it may propagate through the IC, destroying data and causing a soft error in the IC. As the setup and hold times of latches decrease to accommodate increasing processor speeds, the probability that a pulse will satisfy the setup and hold times of a latch will correspondingly increase. Thus, the probability that an SEU will result in a soft error will continue to increase as IC technology advances.

Until recently, IC manufacturers have focused their efforts at improving the reliability of memory nodes for a variety of reasons. For one, memory nodes outnumber logic nodes on almost all ICs. Additionally, until recently, the charge used by logic nodes has usually been sufficient such that SER was relatively low for those nodes. Finally, no cost effective way existed to determine the SER on an IC. In fact, to determine the SER at a particular logic node, the IC manufacturer had to send an actual IC to a facility in Los Alamos, N.M., operated by integrated Robustness on Chips, or iRoC, for testing. iRoC would test the IC by bombarding it with different types of radiation to estimate the SER. Only after obtaining the results of the test of a physical IC could the IC manufacturer determine which logic nodes to improve. Then a new IC had to be fabricated and tested to determine if the changes actually improved the SER. This process has proven to be time-consuming and costly for IC manufacturers.

Therefore, there is a need to provide an improved method and system for estimating the SER of the logic nodes in an IC.

SUMMARY

In accordance with the invention, a method of predicting a logic soft error rate for a circuit of a given technology includes determining a charge stored on at least one logic node in the circuit; estimating a logic soft error rate for at least one logic node in the circuit using a database of logic soft error rate data points, wherein the data points in the database give a soft error rate as a function, at least in part, of a technology of the circuit, a type of product, and a charge of the logic node; and calculating the logic soft error rate of the circuit, wherein the logic soft error rate of the circuit is a function of the logic soft error rate of each logic node.

These and other embodiments of the invention are further discussed below with respect to the following figures.

BRIEF DESCRIPTION OF THE DRAWINGS

Wherever possible, the same reference numbers will be used throughout the drawings to refer to the same or like parts.

DETAILED DESCRIPTION

Figure 3:
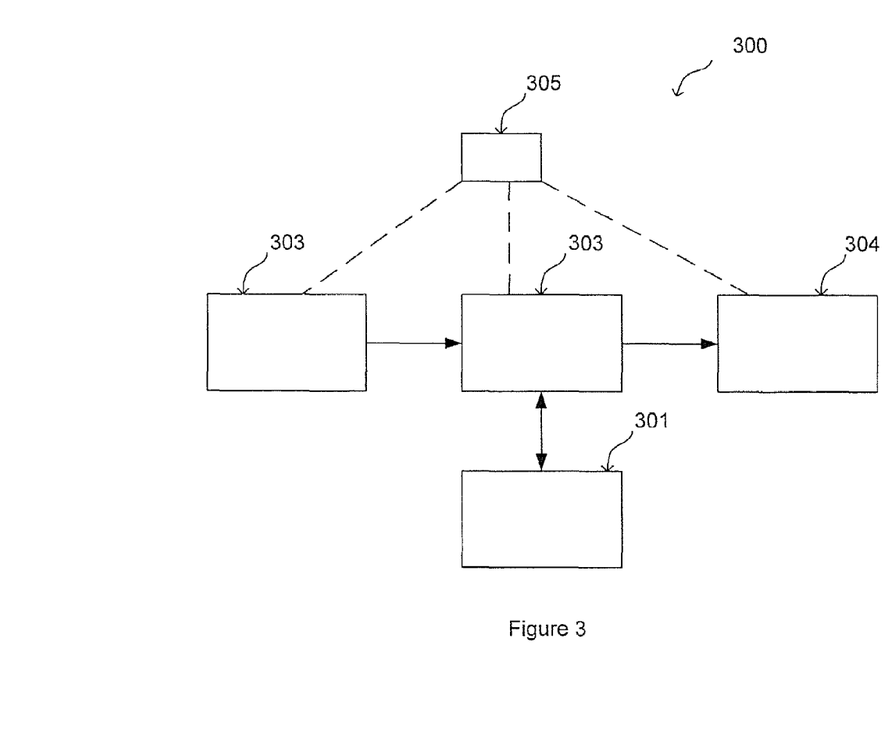
FIG. 3 shows a block diagram of a system capable of predicting the soft-error-rate in an integrated circuit.

FIG. 3 shows an exemplary block diagram of an SER estimating system 300 for estimating the logic SER on an IC. As shown in FIG. 3, one embodiment may include a database 301, an estimating function 302, one or more data input devices 303, and one or more data output devices 304.

The actions of the different components of SER estimating system 300 is controlled in some embodiments by processor 305. As shown in FIG. 3, in some embodiments, processor 305 controllers input devices 303 and output devices 304. Processor 305 in some embodiments also controls the execution of the algorithm used to estimate the logic SER of a circuit on estimating function 302. In some embodiments, the processor can be a central processing unit on a general or specific purpose computer. In some embodiments, the controlling processor can be an application specific integrated circuit. In some embodiments, multiple processors may control the components of SER estimating system 300. These one or more processors execute the steps shown in FIG. 4 to determine the logic SER for an IC.

Referring to FIG. 3, data input device 303 can include any device used for inputting the design of an IC into SER estimating system 300. In some embodiments, data input device 303 can include computer programs used to input the IC design. For example, in some embodiments, a Verilog computer program, which is utilized in the design of ICs, can be used to input an IC design into SER estimating system 300. In some embodiments, a SPICE computer program, which is used in the design of ICs, can be used to input the IC design into SER estimating system 300. In some embodiments, such as the one shown in FIG. 3, more than one data input device 303 can be used to input the IC design into SER estimating function 300.

After receiving the IC design, processor 305 calls and executes estimating function 302. Estimating function 302 receives the input IC design from data input device 303. In some embodiments, estimating function 302 uses the process shown in FIG. 4 to calculate the SER for an IC. As a first step 401, estimating function determines the IC technology used in and product implemented by the IC design. In some embodiments, the IC design received by input device 303 includes this information. A technology is defined based on the line size used in the IC. For example, in some IC designs, line sizes of 0.18 um, 0.15 um, and 0.13 um may result in different technologies. The classification based on different products is made because different products of the same technology may have different SER characteristics For example, the SER characteristics for 4M SRAM, 1M SRAM, and CAM, respectively, may differ even though these products use the same technology.

Figure 6:
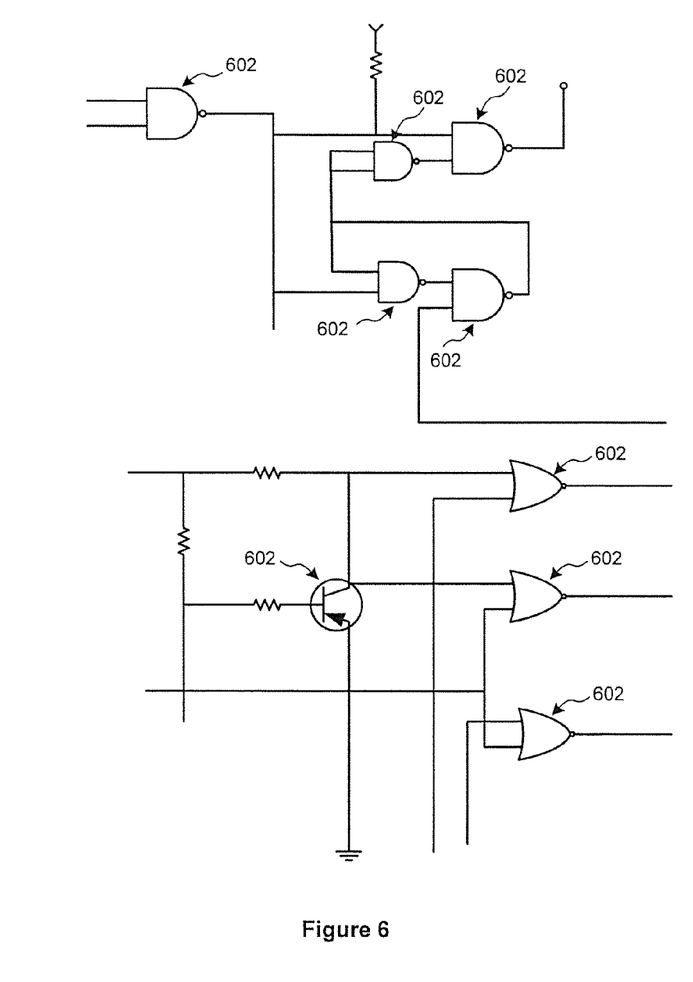
FIG. 6 shows an example of an input IC design with logic nodes.

Referring again to FIG. 4, after determining the IC technology and product, some embodiments of estimating function 302 move to step 402 in which the estimating function identifies each logic node in the IC design. As shown in FIG. 6, after receiving input IC design 601, estimating function 302 locates each logic node 602 in IC design 601. In some embodiments, estimating function 302 locates each logic node 602 using the input from input device 303. In some embodiments, estimating function 302 locates each logic node 602 by a computer program to simulate IC design 601.

Referring again to FIG. 4, some embodiments of estimating function 302 then determine the amount of charge stored on each logic node 602 in IC design 601, as shown in Step 403. In some embodiments, estimating function 302 calculates the charge stored on each logic node 602 using the IC design input via input devices 303. In some embodiments, estimating function 302 determines the charge stored on each logic node 602 using the voltage across and capacitance of each logic node 602. In some embodiments, the data received in the input IC design includes the charge stored on each logic node 602. In some embodiments, estimating function 302 calculates the charge on each logic node 602 by a layout extraction computer program, such as STARRC. Some embodiments use a combination of different methods to calculate the charge stored on each logic node 602.

Figure 4:
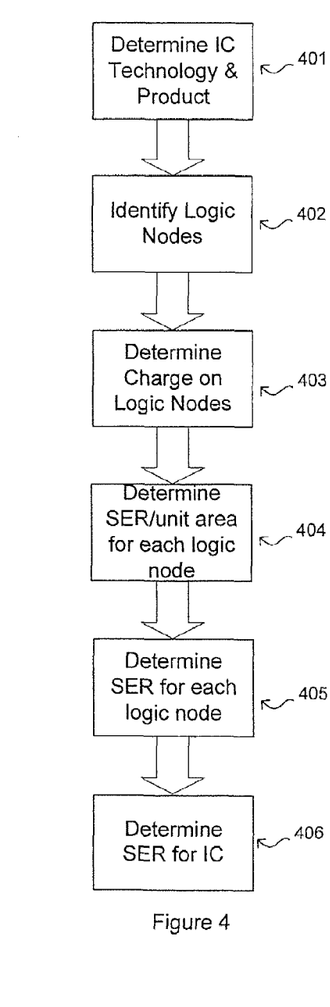
FIG. 4 shows a process for calculating the SER of an IC design according to some embodiments of the present invention.
Figure 7:
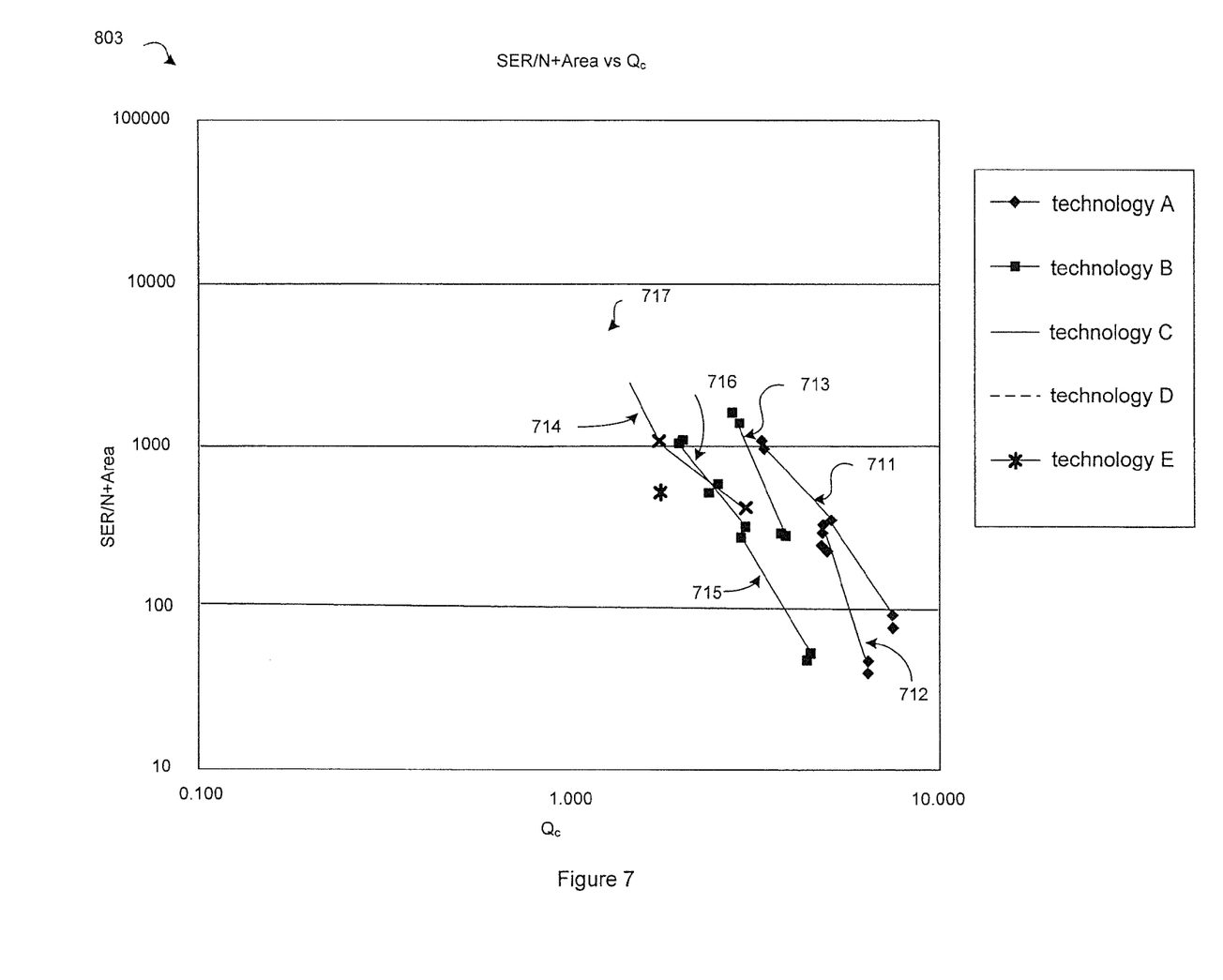
FIG. 7 shows the response curves for different products and different technologies.
Figure 8:
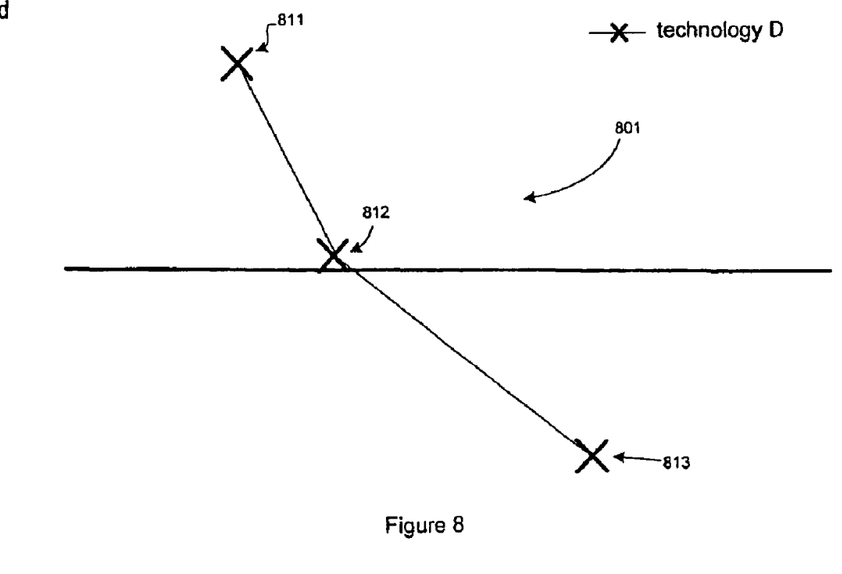
FIG. 8 shows one response curve and its data points.

As shown in step 404 of FIG. 4, after obtaining the charge on each logic node, some embodiments of estimating function then calculate the SER per unit area of each logic node. In some embodiments, estimating function 302 completes this step by calling database 301. As shown in FIG. 7, database 301 contains response curves 711-717 for different types of products in different technologies. Referring to FIG. 8, response curve 801 is composed of multiple data points 811-813. Data points 811-813 represent SER per unit area measurements obtained by testing actual products holding a known charge. X-axis 820 represents the charge, Q, held in a logic node, while y-axis 821 represents the SER per unit area. In some embodiments, the SER per unit area will represent the total SER for all types of radiation that cause SER. In some embodiments, the SER per unit area will be the SER per unit area caused by particular types of radiation or combinations of particular types of radiation. For example, some embodiments of SER estimating system 300 will provide the SER per unit area caused only by alpha particles.

Estimating function 302 can use different mathematical operations to estimate the SER per unit area for each logic node in step 404. Because estimating function 302 has obtained the charge on each logic node, it can use the response curves in database 301 to calculate the SER per unit area. Some embodiments of estimating function 302 use interpolation to calculate the SER per unit area if the charge used by the logic node falls within data points 512*a-d*. Estimating function 302 can also use extrapolation to estimate the SER per unit area if the charge used by the logic node falls outside of the data points 512*a-d*. Some embodiments of estimating function 302 use curve fitting to generate a model to calculate the SER per unit area. Some embodiments use a combination of techniques to calculate the SER per unit area.

Figure 5:
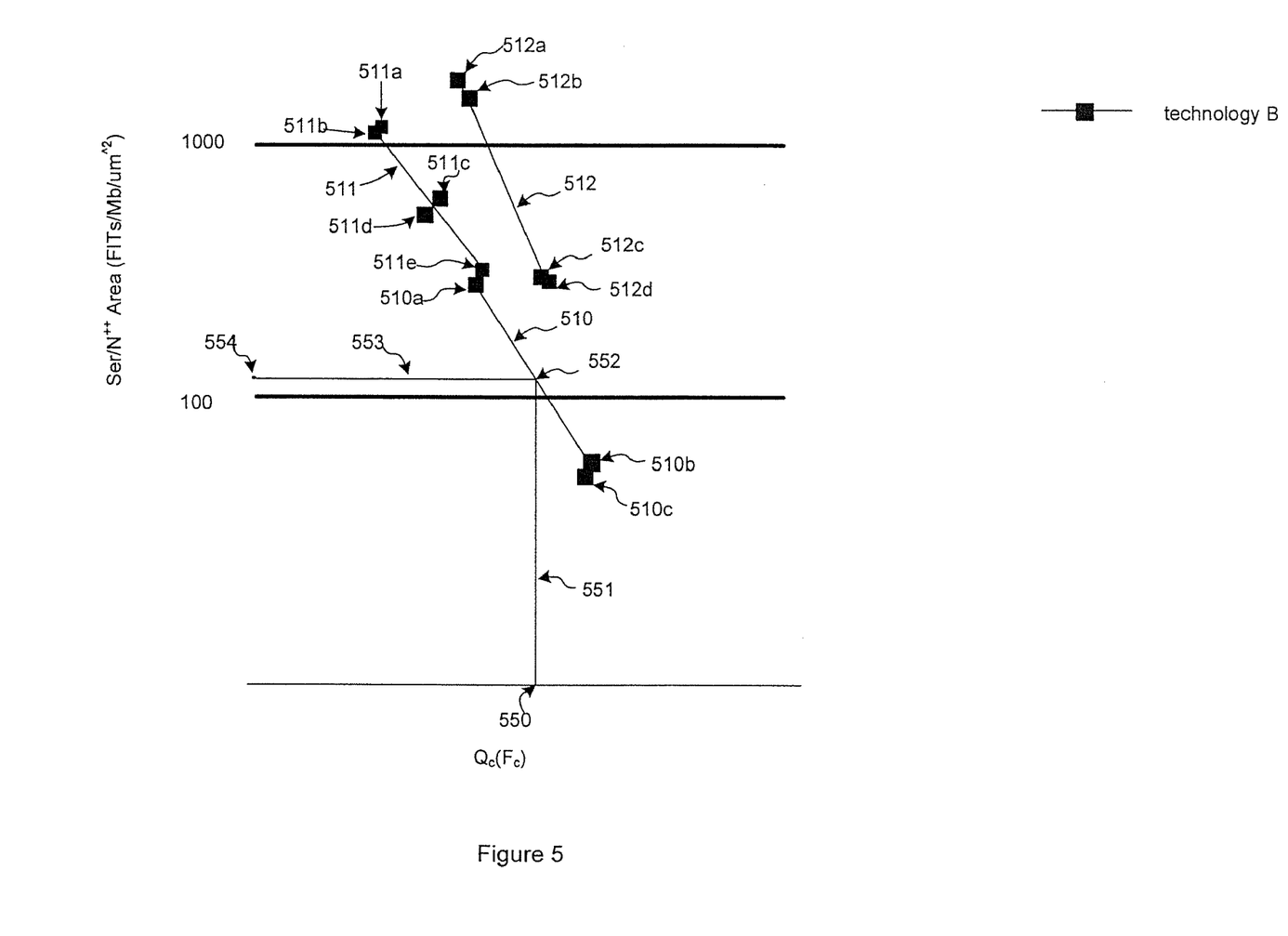
FIG. 5 shows response curves between SER and charge for different products of the same technology.

An example of using interpolation to estimate the SER per unit area of a logic node is shown in FIG. 5. Referring to FIG. 5, the SER per unit area of a logic node of the same technology and product used to produce response curve 510 can be calculated using response curve 510. In this example, the logic node uses a charge represented by point 550 on the X-axis. To estimate the SER per unit area, the estimating function determines the location on response curve 510 having the same charge as on the logic node at point 550. In FIG. 5, this determination is shown by vertical line 551 which intersects response curve 510 at intersection 552 where the response curve has the same charge as the charge represented by point 550. Estimating function 302 then determines the SER at intersection 552. This determination is shown by horizontal line 553, which connects intersection 552 to the Y-axis at point 554. The value at point 554 corresponds to the estimated SER per unit area for the logic node using the charge at point 550. In some embodiments, estimating function 302 determines the SER per unit area by determining the equation for response curve 510. It can then use the value at point 550 to determine the SER per unit area at point 554.

Referring again to FIG. 4, some embodiments of estimating function 302 then calculate the SER for each logic node, as shown in step 405. To calculate the SER for a logic node, estimating function 302 must determine the surface area of each logic node. Surface area refers to the area of logic node 602 on the IC that may absorb radiation. Some embodiments determine the area of each logic node using the IC design that was input using input devices 303. In some embodiments, the data received with the IC design includes the area of each logic node 602. In some embodiments, estimating function 302 calculates the area of each logic node 602 by a layout extraction computer program. Some embodiments use a combination of different methods to calculate the area of each logic node 602. Estimating function 302 calculates the SER for a logic node 602 by multiplying the area of the individual logic node by the SER per unit area obtained in the previous step from database 301 for the logic node. Some embodiments of estimating function 302 calculate the SER for each logic node by a model generated by curve fitting.

As shown in FIG. 4, estimating function 302 then proceeds to calculate the SER for the entire IC. Some embodiments of estimating function 302 perform this step by summing the SER values for each individual logic node. Some embodiments of estimating function 302 obtain the SER for the IC by summing the SER values for logic nodes with the most significant contribution to the total SER.

Those skilled in the art will realize that some of the steps described in FIG. 4 can be performed simultaneously with other steps. For example, some embodiments of estimating function 302 can perform steps 403 through 405 for each logic node before performing the same steps for the next logic node.

Those skilled in the art will also realize that multiple processors can perform estimating function 302. In some embodiments, one processor may obtain the charge on each logic node from input device 303, as shown in step 403 in FIG. 4, but then pass this information to a second processor associated with database 301. The second processor can then determine the SER per unit area for each logic node, as shown in step 404 in FIG. 4, using database 301, and then pass this information back to the first processor to continue with the process shown in FIG. 4.

Figure 9:
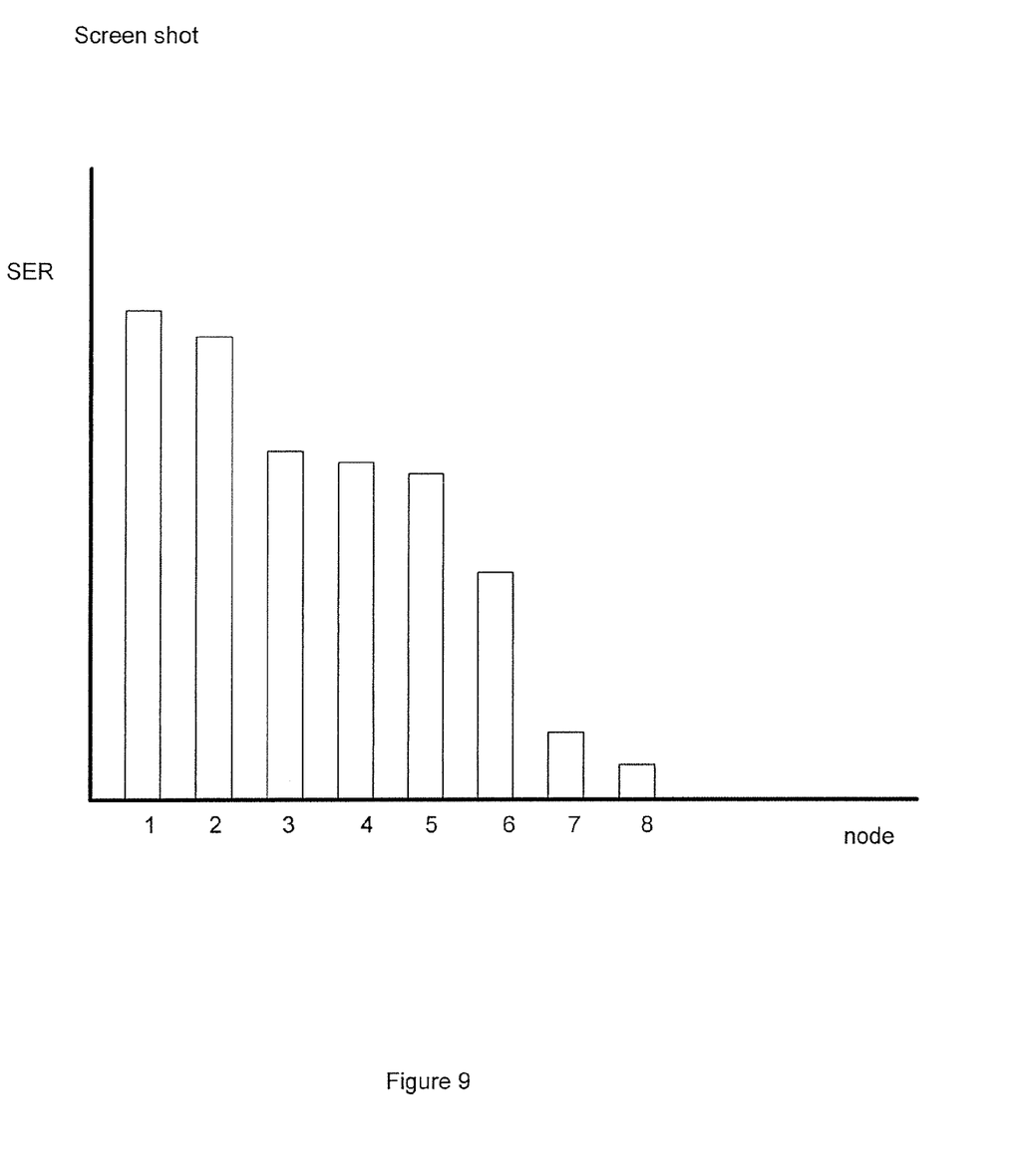
FIG. 9 shows a screen shot in which the logic nodes are ranked according to their SER.

After obtaining the SER value for the IC and the SER value for each logic node, estimating function 302 may use these values to produce the output requested of SER estimating system 300. In some embodiments, estimating function 302 produces the SER value for the IC on output devices 304, as shown in FIG. 3. In some embodiments, estimating function 302 produces on output device 304 a ranking of the logic nodes according to their individual logic SER values. For example, estimating function 302 can list the logic nodes with the highest SER first to allow the user to focus correction efforts on the logic nodes that will bring about the biggest improvement to the SER of the design of the IC. This type of ranking is shown in screen shot 901 in FIG. 9.

Some embodiments of SER estimating system 300 will suggest different actions to take to improve the SER value of the IC. In some embodiments, SER estimating system 300 produces a list of logic nodes with the highest SER values along with suggested actions to take to improve the SER value of each logic node. These suggestions may come from known techniques used to improve the error rate of data memory nodes. In some embodiments, these techniques include increasing the capacitance of the node, decreasing the surface area of the node, and creating a deep well of the appropriately charged particle next to the logic node to be improved. Some embodiments of estimating function 302 will take as additional input from input device 303 a logic SER threshold value that the user desires the IC to possess. Estimating function 302 may then produce on output device 304 suggested logic nodes to be improved and methods to improve them so that the SER value of the IC will be below this threshold. Some embodiments of SER estimating system produce recommendations of how to improve input from device 303 on output device 304. Some embodiments of SER estimating system 300 can produce each of these different types of output on output device 304. Some embodiments of SER estimating system 300 allow the user of system 300 to request that system 300 produce a particular type of output.

Figure 10:
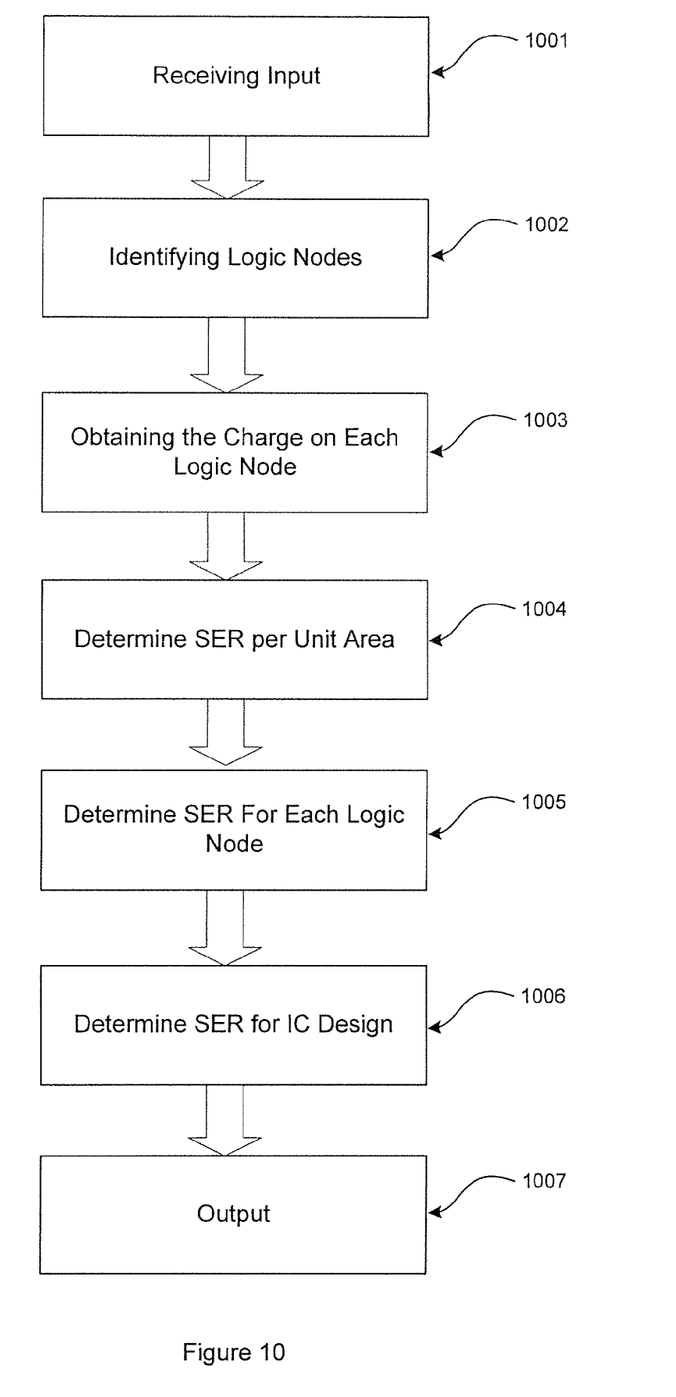
FIG. 10 shows an exemplary process for estimating the SER for an IC design.

FIG. 10 illustrates a method according to some embodiments of the present invention for calculating the SER of an IC design. The method shown in FIG. 10 includes the steps of receiving input 1001 that includes a depiction of the IC design; identifying each logic node 1002 on the IC design; obtaining the charge 1003 on each logic node of the IC design; determining the SER per unit area 1004 for each logic node; determining the SER for each logic node 1005; and determining the SER 1006 for the IC design.

Referring to FIG. 10, in some embodiments, the first step 1001 involves receiving input about the IC design. In some embodiments, the input is obtained using computer software, such as Verilog, that depicts the IC design. In some embodiments, the input includes the type of technology used to construct the IC and the type of product implemented by the IC design. The type of technology refers to the identification of device sizes, line sizes, wafer sizes, and semiconductor processing steps used to produce the IC. The characteristics of each node in the IC, in particular the amount of charge used at each node and the response of that node to incident radiation, is dependent on the technology parameters. For example, the capacitance of a node is dependent on the size of the node and on the materials surrounding the node. The capacitance of the node and the operating voltages of the resulting IC (which is also a technology parameter) determine the charge stored at the node. Additionally, different products composed of the same technology can affect the amount of charge used at each node and the response of a node to incident radiation. For example, 4M SRAM, 1M SRAM, and CAM of the same technology can all produce different SERs even when using the same amount of charge. Accordingly, these same parameters can also be utilized, along with response curves such as those shown in FIGS. 5, 7, and 8, to predict the response of a particular node to radiation incident on the IC.

Referring to FIG. 10, step 1002 involves identifying each logic node in the IC design. In some embodiments, this step may be accomplished using a computer program. An example of such a computer program would be the Verilog program.

Again, referring to FIG. 10, in some embodiments the next step 1003 involves obtaining the charge on each logic node. Some embodiments complete step 1003 at the same time as completing step 1002 for each node. For example, some embodiments will calculate the charge stored on each logic node as each logic node is identified. Some embodiments calculate the charge stored from the capacitance of and voltage across each logic node. Some embodiments obtain the charge stored on each logic node by a layout extraction computer program. Some embodiments calculate the charge stored on each logic node using any one of the previously identified methods.

The next step 1004 in some embodiments involves estimating the SER per unit area for each logic node. Using the information about the type of technology and the type of product obtained in step 1001, some embodiments will retrieve a response curve corresponding to the same technology and product. As shown in FIG. 5, different products of the same technology can result in different SER response curves such as those shown in response curves 510, 511, and 512, shown in FIG. 5. Examples of different products having different response curves despite being composed of the same technology include 4M SRAM, 1M SRAM, and CAM. Response curves 510, 511, and 512 are formed by data points 510a-c, 511a-e, and 512a-d, respectively. In some embodiments, data points 510a-c, 511a-e, and 512a-d will correspond to the SER per unit area obtained for actual ICs of the same technology and product that undergo testing, such as at the iRoC facility, to determine the SER. In some embodiments, the SER per unit area will correspond to the SER for all types of radiation that may cause an SER. In some embodiments, the SER per unit area will correspond to the SER for only one or more types of radiation that may cause SER. The value for the SER per unit area for each data point 510a-c, 511a-e, and 512a-d will be a function of the charge used by the logic node. The method uses response curves 510, 511, and 512, and the charge used by each logic node determined in step 1003 to estimate the SER for each logic node.

Different methods may be used in step 1004 to determine the SER per unit area. As describe earlier, some embodiments use interpolation or extrapolation to estimate the SER per unit area for a logic node storing a particular charge. Some embodiments use curve fitting to generate a model to estimate the SER per unit area. Some embodiments use a combination of these methods to estimate the SER.

Referring back to FIG. 10, step 1005 involves estimating the SER for each logic node. As part of the information obtained in step 1001, the method should be able to calculate the area of each logic node. The area of each logic node refers to the surface area of the logic node that is exposed to radiation. In some embodiments, the surface area may be calculated from the input IC design. In some embodiments, the surface area may be part of the input received in step 1001. In some embodiments, the surface area may be determined by a layout extraction computer program. In some embodiments, the surface area may be determined using any one of these methods. After calculating the surface area of the logic node, some embodiments of the invention will multiply the surface area of the logic node by the SER per unit area for the logic node produced in step 1004. Some embodiments may calculate the SER by a model generated by curve fitting.

In step 1006, the method calculates the SER of the entire IC. Some embodiments complete this step by summing the separate SERs determined for each logic node in step 1005. Some embodiments complete this step by summing the SER values for logic nodes with the most significant contribution to the total SER.

Referring to step 1007, the method will output the predicted SER values. Some embodiments output the value of the predicted SER for the entire IC. Some embodiments output a ranking of the logic nodes according to each logic nodes' predicted SER. This output allows a user of the method to focus SER prevention efforts on those logic nodes with the highest predicted SER. Some embodiments will output the predicted SER for each logic node and suggest specific improvements for some or all of the logic nodes.

These improvements may be based on well known methods of improving the error rate on memory nodes, such as one or more of increasing the capacitance on the node, decreasing the surface area of the node, and placing a deep well of the appropriately charged particle next to the logic node.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of predicting a logic soft error rate for a circuit of a given technology using a processor that executes an estimating function to perform the method comprising:
    determining, by the processor, a charge stored on at least one logic node in the circuit;
    estimating a logic soft error rate for at least one logic node in the circuit using the processor operatively coupled to a database of logic soft error rate data points, wherein the data points in the database give a soft error rate as a function, at least in part, of a technology of the circuit, a type of product, and a charge of the logic node; and
    calculating, using the processor, the logic soft error rate of the circuit, wherein the logic soft error rate of the circuit is a function of the logic soft error rate of each logic node.

2. The method of claim 1, wherein the step of calculating the logic soft error rate of the circuit is performed by summing the logic soft error rates of each logic node.

3. The method of claim 1, further comprising the step of ranking the at least one logic node and another logic node according to a logic soft error rate of each logic node.

4. The method of claim 3, further comprising the step of reducing the logic soft error rate for a subset of the at least one logic node and another logic node.

5. The method of claim 4, wherein the subset is composed of nodes with a logic soft error rate above a certain value.

6. The method of claim 4, wherein the subset of nodes is a function of a threshold soft error rate for the circuit.

7. The method of claim 4, wherein the step of reducing the logic soft error rate is accomplished by performing at least one of the following on each of the nodes in the subset of nodes:
    decreasing the area of the logic node;
    adding additional capacitance to the logic node; and
    placing a deep well under the logic node to shield it.

8. A computer program, tangibly embodied on a computer-readable medium, for predicting a logic soft error rate of a circuit of a given technology, wherein the computer program has as inputs a database of logic soft error rate data points and the circuit, the computer program comprising:
    code for calculating a charge stored on at least one logic node in the circuit;
    code for estimating a logic soft error rate of a logic node in the circuit using the database of data points, the area of the logic node, the charge stored on the logic node, and the technology of the circuit;
    code for calculating the logic soft error rate for the circuit as a function of the logic soft error rate for the at least one logic node.

9. The computer program of claim 8, wherein the data points used by the code for estimating a logic soft error rate is further a function of a product of the circuit.

10. The computer program of claim 8, wherein the code for calculating the logic soft error rate for the circuit calculates the logic soft error rate for the circuit by summing the logic soft error rates for each logic node in the circuit.

11. The computer program of claim 8, further comprising code for ranking the at least one logic node and another logic node according to a logic soft error rate of each node.

12. The computer program of claim 8, further comprising code for determining a subset of logic nodes, the logic nodes comprising the at least one logic node and another logic node.

13. The computer program of claim 12, wherein the code for determining the subset of logic nodes determines the subset of logic nodes based, at least on part, on a target logic soft error rate of the circuit.

14. The computer program of claim 13, wherein the target soft error rate is determined by a user of the program.

15. The computer program of claim 13, further comprising code for suggesting actions to take to reduce the logic soft error rate for each logic node in the subset of logic nodes.

16. The computer program of claim 15, wherein the suggested actions include at least one of the following for each logic node in the subset of logic nodes:
    decreasing the area of the logic node;
    adding additional capacitance to the logic node; and
    placing a deep well under the logic node to shield it.

17. The computer program of claim 12, wherein the subset of logic nodes consists of logic nodes with a logic soft error rate above a certain value.

18. The computer program of claim 17, wherein the certain value is set by a user of the computer program.

19. The computer program of claim 8, wherein the computer program is run on a general application computer.

20. The computer program of claim 19, wherein the computer program accesses the database using a network.

* * * * *